US008368189B2

(12) United States Patent
Sirinorakul

(10) Patent No.: US 8,368,189 B2
(45) Date of Patent: Feb. 5, 2013

(54) AUXILIARY LEADFRAME MEMBER FOR STABILIZING THE BOND WIRE PROCESS

(75) Inventor: Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 20 days.

(21) Appl. No.: 12/960,268

(22) Filed: Dec. 3, 2010

(65) Prior Publication Data

US 2011/0133319 A1 Jun. 9, 2011

Related U.S. Application Data

(60) Provisional application No. 61/266,819, filed on Dec. 4, 2009.

(51) Int. Cl.
*H01L 21/00* (2006.01)
*H01L 23/495* (2006.01)
(52) U.S. Cl. ........................................ 257/666; 438/123
(58) Field of Classification Search .................. 257/666; 438/123
See application file for complete search history.

(56) References Cited

U.S. PATENT DOCUMENTS

| | | | | |
|---|---|---|---|---|
| 3,611,061 A | 10/1971 | Segerson | ................. | 317/234 R |
| 4,411,719 A | 10/1983 | Lindberg | ........................ | 156/64 |
| 4,501,960 A | 2/1985 | Jouvet et al. | .................... | 235/492 |
| 4,801,561 A | 1/1989 | Sankhagowit | ................ | 437/207 |
| 4,855,672 A | 8/1989 | Shreeve | ..................... | 324/158 R |
| 5,105,259 A * | 4/1992 | McShane et al. | ............. | 257/667 |
| 5,195,023 A * | 3/1993 | Manzione et al. | ............ | 361/728 |
| 5,247,248 A | 9/1993 | Fukunaga | ..................... | 324/158 |
| 5,248,075 A | 9/1993 | Young et al. | .................... | 228/5.1 |
| 5,250,841 A * | 10/1993 | Sloan et al. | ................... | 257/666 |
| 5,281,851 A * | 1/1994 | Mills et al. | ..................... | 257/670 |
| 5,396,185 A | 3/1995 | Honma et al. | ................ | 324/754 |
| 5,397,921 A | 3/1995 | Karnezos | ....................... | 257/779 |
| 5,479,105 A | 12/1995 | Kim et al. | ..................... | 324/755 |
| 5,535,101 A | 7/1996 | Miles et al. | | |
| 5,596,231 A | 1/1997 | Combs | ......................... | 257/776 |
| 5,843,808 A | 12/1998 | Karnezos | ..................... | 438/121 |
| 5,990,692 A | 11/1999 | Jeong et al. | .................... | 324/755 |
| 6,072,239 A | 6/2000 | Yoneda et al. | ................ | 257/730 |
| 6,111,324 A | 8/2000 | Sheppard et al. | ............. | 257/787 |
| 6,159,770 A | 12/2000 | Tetaka et al. | .................. | 438/112 |
| 6,197,615 B1 * | 3/2001 | Song et al. | .................... | 438/111 |
| 6,208,020 B1 * | 3/2001 | Minamio et al. | .............. | 257/684 |
| 6,229,200 B1 | 5/2001 | Mclellan et al. | ............. | 257/666 |
| 6,242,281 B1 | 6/2001 | Mclellan et al. | ............. | 438/106 |
| 6,250,841 B1 | 6/2001 | Ledingham | | |
| 6,284,569 B1 | 9/2001 | Sheppard et al. | ............. | 438/110 |
| 6,285,075 B1 | 9/2001 | Combs et al. | ................ | 257/675 |
| 6,294,100 B1 | 9/2001 | Fan et al. | ........................ | 216/14 |
| 6,304,000 B1 | 10/2001 | Isshiki et al. | .................. | 257/782 |
| 6,326,678 B1 | 12/2001 | Karnezos et al. | ............. | 257/666 |

(Continued)

OTHER PUBLICATIONS

Michael Quirk and Julian Serda, Semiconductor Manufacturing Technology, Pearson Education International, Pearson Prentice Hall, 2001, p. 587-588.

(Continued)

*Primary Examiner* — James Mitchell
(74) *Attorney, Agent, or Firm* — Haverstock & Owens LLP

(57) ABSTRACT

A semiconductor package comprises a die attach pad and an auxiliary support member at least partially circumscribing the die attach pad. A set of contact leads is formed extending outward from the die attach pad. A first set of contact pads is formed on the bottom surface of the distal ends of the contact leads. An optional second set of contact pads is formed at the bottom surface of the proximal end. The auxiliary support member prevents damage to the contact leads and prevents the leads from bending during the manufacturing process.

17 Claims, 13 Drawing Sheets

U.S. PATENT DOCUMENTS

| | | | |
|---|---|---|---|
| 6,329,711 B1 | 12/2001 | Kawahara et al. | 257/698 |
| 6,353,263 B1 | 3/2002 | Dotta et al. | 257/777 |
| 6,376,921 B1 | 4/2002 | Yoneda et al. | 257/787 |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | 438/108 |
| 6,451,709 B1 | 9/2002 | Hembree | 438/759 |
| 6,455,348 B1 | 9/2002 | Yamaguchi | 438/106 |
| 6,489,218 B1 | 12/2002 | Kim et al. | 438/460 |
| 6,498,099 B1 | 12/2002 | McLellan et al. | 438/689 |
| 6,507,116 B1 | 1/2003 | Caletka et al. | 257/778 |
| 6,545,332 B2 | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,667,191 B1 | 12/2003 | McLellan et al. | 438/121 |
| 6,683,368 B1 | 1/2004 | Mostafazadeh | |
| 6,686,667 B2 | 2/2004 | Chen et al. | 257/787 |
| 6,703,696 B2 | 3/2004 | Ikenaga et al. | 257/678 |
| 6,723,585 B1 | 4/2004 | Tu et al. | |
| 6,724,071 B2 | 4/2004 | Combs | 257/666 |
| 6,734,044 B1 | 5/2004 | Fan et al. | 438/123 |
| 6,734,552 B2 | 5/2004 | Combs et al. | 257/707 |
| 6,737,755 B1 | 5/2004 | McLellan et al. | 257/796 |
| 6,764,880 B2 | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 | 11/2004 | Islam et al. | 257/666 |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/666 |
| 6,894,376 B1 * | 5/2005 | Mostafazadeh et al. | 257/684 |
| 6,897,428 B2 | 5/2005 | Minamio et al. | 250/208.1 |
| 6,927,483 B1 * | 8/2005 | Lee et al. | 257/676 |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,049,177 B1 | 5/2006 | Fan et al. | 438/123 |
| 7,060,535 B1 | 6/2006 | Sirinorakul et al. | 438/123 |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,125,747 B2 * | 10/2006 | Lee et al. | 438/112 |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,259,678 B2 * | 8/2007 | Brown et al. | 340/572.8 |
| 7,274,088 B2 | 9/2007 | Wu et al. | 257/673 |
| 7,314,820 B2 | 1/2008 | Lin et al. | 438/617 |
| 7,315,077 B2 * | 1/2008 | Choi et al. | 257/666 |
| 7,315,080 B1 | 1/2008 | Fan et al. | 257/717 |
| 7,342,305 B1 | 3/2008 | Diao et al. | 257/706 |
| 7,344,920 B1 | 3/2008 | Kirloskar et al. | 438/123 |
| 7,348,663 B1 | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 | 7/2008 | Shim et al. | 438/106 |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,482,690 B1 | 1/2009 | Fan et al. | 257/724 |
| 7,495,319 B2 | 2/2009 | Fukuda et al. | |
| 7,595,225 B1 | 9/2009 | Fan et al. | 438/112 |
| 7,608,484 B2 * | 10/2009 | Lange et al. | 438/114 |
| 7,709,857 B2 * | 5/2010 | Kim et al. | 257/100 |
| 7,714,418 B2 | 5/2010 | Lim et al. | 257/670 |
| 7,732,259 B2 * | 6/2010 | Low et al. | 438/123 |
| 8,035,207 B2 * | 10/2011 | Camacho et al. | 257/678 |
| 2002/0109214 A1 | 8/2002 | Minamio et al. | |
| 2003/0006055 A1 | 1/2003 | Chien-Hung et al. | |
| 2003/0045032 A1 | 3/2003 | Abe | 438/123 |
| 2003/0071333 A1 | 4/2003 | Matsuzawa | 257/676 |
| 2003/0143776 A1 | 7/2003 | Pedron, Jr. et al. | 438/106 |
| 2003/0178719 A1 | 9/2003 | Combs et al. | 257/704 |
| 2003/0201520 A1 | 10/2003 | Knapp et al. | 257/666 |
| 2003/0207498 A1 | 11/2003 | Islam et al. | 438/120 |
| 2004/0014257 A1 | 1/2004 | Kim et al. | 438/111 |
| 2004/0026773 A1 * | 2/2004 | Koon et al. | 257/692 |
| 2004/0046237 A1 | 3/2004 | Abe et al. | 257/676 |
| 2004/0046241 A1 | 3/2004 | Combs et al. | 257/678 |
| 2004/0070055 A1 | 4/2004 | Punzalan et al. | |
| 2004/0080025 A1 | 4/2004 | Kasahara et al. | 257/666 |
| 2004/0110319 A1 | 6/2004 | Fukutomi et al. | 438/106 |
| 2005/0003586 A1 | 1/2005 | Shimanuki et al. | 438/124 |
| 2005/0077613 A1 | 4/2005 | McLellan et al. | 257/706 |
| 2005/0236701 A1 | 10/2005 | Minamio et al. | |
| 2005/0263864 A1 * | 12/2005 | Islam et al. | 257/676 |
| 2006/0071351 A1 | 4/2006 | Lange | |
| 2006/0192295 A1 | 8/2006 | Lee et al. | 257/778 |
| 2006/0223229 A1 | 10/2006 | Kirloskar et al. | 438/106 |
| 2006/0223237 A1 | 10/2006 | Combs et al. | 438/122 |
| 2006/0273433 A1 | 12/2006 | Itou et al. | 257/666 |
| 2007/0001278 A1 | 1/2007 | Jeon et al. | 257/676 |
| 2007/0013038 A1 * | 1/2007 | Yang | 257/666 |
| 2007/0029540 A1 | 2/2007 | Kajiwara et al. | |
| 2007/0200210 A1 | 8/2007 | Zhao et al. | 257/676 |
| 2007/0235217 A1 | 10/2007 | Workman | 174/260 |
| 2008/0048308 A1 | 2/2008 | Lam | 257/686 |
| 2008/0150094 A1 | 6/2008 | Anderson | 257/659 |
| 2009/0152694 A1 * | 6/2009 | Bemmerl et al. | 257/670 |
| 2009/0230525 A1 * | 9/2009 | Chang Chien et al. | 257/676 |
| 2009/0236713 A1 * | 9/2009 | Xu et al. | 257/676 |
| 2010/0133565 A1 * | 6/2010 | Cho et al. | 257/98 |
| 2010/0149773 A1 * | 6/2010 | Said | 361/783 |
| 2011/0201159 A1 * | 8/2011 | Mori et al. | 438/123 |

OTHER PUBLICATIONS

Office Action dated Apr. 25, 2012, U.S. Appl. No. 12/960,268, filed Dec. 3, 2010, Somchai Nondhasitthichai et al.

* cited by examiner

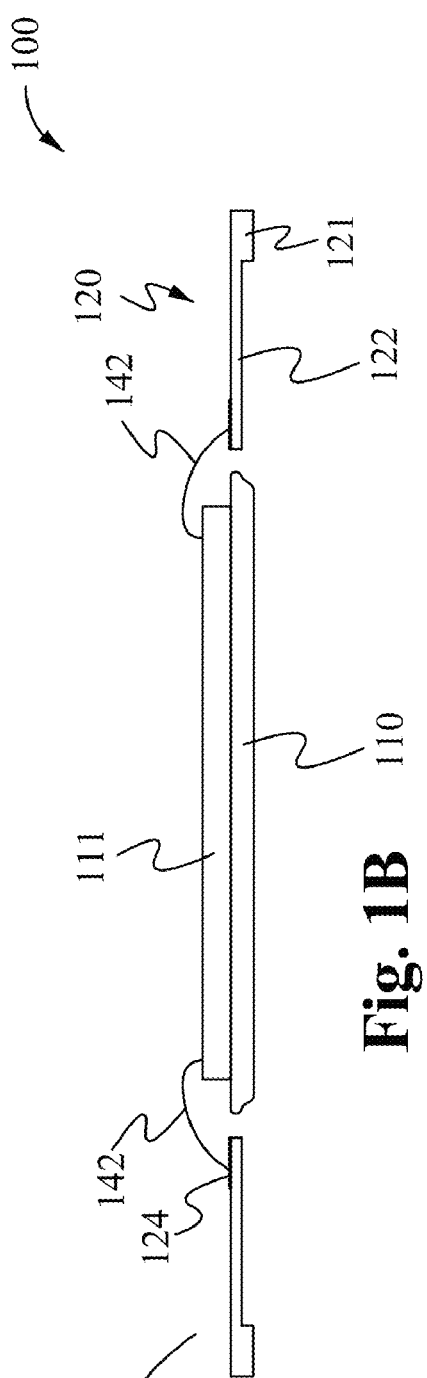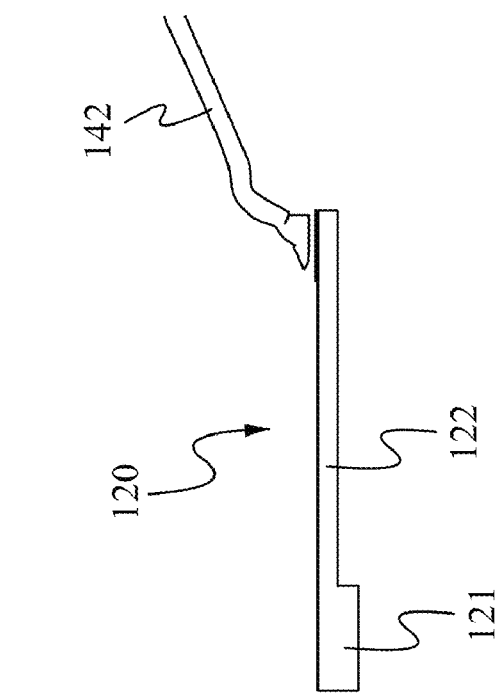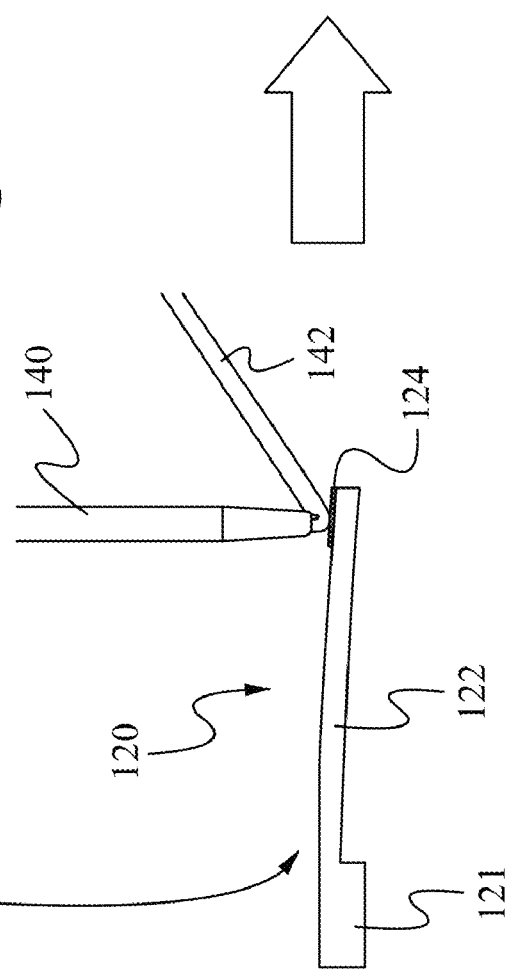

AUXILIARY LEADFRAME MEMBER FOR STABILIZING THE BOND WIRE PROCESS

RELATED APPLICATIONS

This application claims benefit of priority under 35 U.S.C. section 119(e) of the co-pending U.S. Provisional Patent Application Ser. No. 61/266,819 filed Dec. 4, 2009, entitled "AUXILIARY LEADFRAME PORTION FOR STABILIZING WIRE BOND AND AVOIDING BEND LEAD DURING HANDLING," which is hereby incorporated by reference in its entirety.

FIELD OF THE INVENTION

The present invention is related to the field of semiconductor device manufacturing. More specifically, the present invention relates to leadframes for stabilizing wire bond placement and avoiding bent leads.

BACKGROUND

In general, multiterminal integrated circuit (IC) packages are formed from a copper leadframe. FIG. 1A shows such a prior art process. A bare copper leadframe 100 shown in a top view and a bottom view is partially etched to pattern the contact leads 120 and the die attach pad 110. The partial etching is able to be done in any number of ways known by the person of ordinary skill. The contact leads 120 are generally etched to a partial thickness portion 122 and a full thickness portion 121. As used herein, the term "full thickness" generally denotes a member or structure being the same thickness as the original monolithic metal substrate from which the structure is etched. "Partial thickness" generally denotes that the structure has been etched to a partially, so the thickness is some fraction of the thickness of the original substrate. The full thickness portion 121 is such that the bottom surface 123 is exposed when the leadframe 100 is eventually encased in a mold compound. The exposed area of the full thickness portion 121 is soldered into application, such as a PC board having several traces and contact pads for forming an electrical connection with a semiconductor die (not shown) housed within the IC package. The partial thickness portion 122 extends away from the die attach pad 110. A plated portion 124 at the end of the contact lead 120 closest to the die attach pad 110, or the proximal end, receives a wire bond (not shown) for forming an electrical connection with a semiconductor die. As a result, an electrical connection is formed between the semiconductor die and the bottom surface 123 of the contact lead 120.

FIG. 1B shows a cross section of the copper leadframe 100 and the contact leads 120. A semiconductor die 111 is mounted on a top surface of the die attach pad 110. Bond wires 142 are mounted from the semiconductor die 111 to the partial thickness portion 122 of the contact lead 120. However, as shown in FIG. 1C, because of the flexible nature of most metals including copper, the partial thickness portion 122 bends when a capillary 140 attempts to place the bond wire 142 onto the plated end 124. Therefore, as shown in FIG. 1D, the partial thickness portion 122 rebounds and may cause the bond wire 142 to lift before a proper weld can be established. As a result, the entire device is generally scrapped, as the time-cost of repair can outweigh the cost of a new unit. Furthermore, as shown in FIG. 1E, the partial thickness portions 122' can easily become bent or destroyed due to improper handling. Again, the leadframe 100 with the bent contact leads 120' is scrapped. Such scrap adversely affects manufacturing yield. It is well known that the semiconductor industry is highly cost driven, and any phenomenon that causes lower than optimum yield causes manufacturing costs to increase. To that end, it is highly desirable to optimize manufacturing yield.

SUMMARY OF THE DISCLOSURE

What is provided is a leadframe substrate having contact leads and an auxiliary support member for preventing bending of the contact leads during handing and manufacturing. Preferably, the auxiliary support member is integrally formed with the leadframe in an etching process. The auxiliary support member provides support for the contact leads to prevent bending of the leads during a manufacturing step and also prevents damage to the contact leads during handling. The auxiliary support member is removed by a later processing step when no longer needed, thereby electrically isolating all of the contact leads with respect to each other. As a result, a more robust bond wire connection can be made without damaging the contact leads. As a result, yield is improved with respect to contact leads that are bent or destroyed during handling and manufacturing.

In a first aspect of the invention, a semiconductor package comprises a die attach pad and at least one semiconductor die coupled with the die attach pad. In some embodiments, a groove at least partially circumscribes the die attach pad. Preferably, the package further comprises a set of contact leads extending outwards from the die attach pad and positioned above the groove, each contact lead having a proximal end and a distal end and a plurality of bond wires for electrically coupling the die to at least one contact pad. The groove is formed by the removal of the auxiliary support thereby electrically isolating the contact leads. In some embodiments, each contact lead comprises a full thickness portion at the distal end and a partial thickness portion at the proximal end. Alternatively, the removal of the auxiliary support member forms full thickness portions at the proximal ends of the contact leads such that each contact lead comprises a contact pad on the bottom surface of the proximal end. In some embodiments, the groove is filled by an epoxy filler.

In another aspect of the invention, a method of making a semiconductor package comprises etching a through pattern in a metal substrate, thereby forming a die attach pad, a set of contact leads having a first set of contact pads surrounding the die attach pad and an auxiliary support member substantially circumscribing the die attach pad. Then, at least one semiconductor die is mounted on the die attach pad. Then, bond wires are placed electrically coupling the semiconductor die to the contact leads and contact pads. Then, the leadframe, bond wires and semiconductor die are at least partially encased in a mold compound, and the auxiliary support member is etched away, electrically isolating the contact leads. In some embodiments, forming a set of contact leads comprises forming a full thickness portion at the distal end and forming a partial thickness portion at the proximal end. Also, etching away at least a portion of the auxiliary support member can form a second set of contact pads.

In another aspect of the invention, a leadframe for supporting a semiconductor die, comprises a plurality of die attach pads arranged in a matrix, a set of contact leads, each contact lead having a proximal end and a distal end, an auxiliary support member at least partially circumscribing each of the die attach pads, wherein each set of contact leads is positioned above the auxiliary support member. As described above, the auxiliary support member effectuates a more robust manufacturing process. The auxiliary support member prevents the contact leads from being bent during handling or during the bond wiring process. In some embodiments, each contact lead comprises a contact pad on a bottom surface of the distal end and a contact pad on a bottom surface of the proximal end. Also, each contact lead comprises a full thickness portion at the distal end. In some embodiments, each contact lead comprises a partial thickness portion at the proximal end.

BRIEF DESCRIPTION OF THE DRAWINGS

The novel features of the invention are set forth in the appended claims. However, for purpose of explanation, several embodiments of the invention are set forth in the following figures.

FIG. 1B shows a prior art leadframe in cross section.

FIG. 1C shows a prior art leadframe in a manufacturing step.

FIG. 1D shows a prior art leadframe in a manufacturing step.

DETAILED DESCRIPTION

Reference will now be made in detail to the embodiments of the leadframe method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
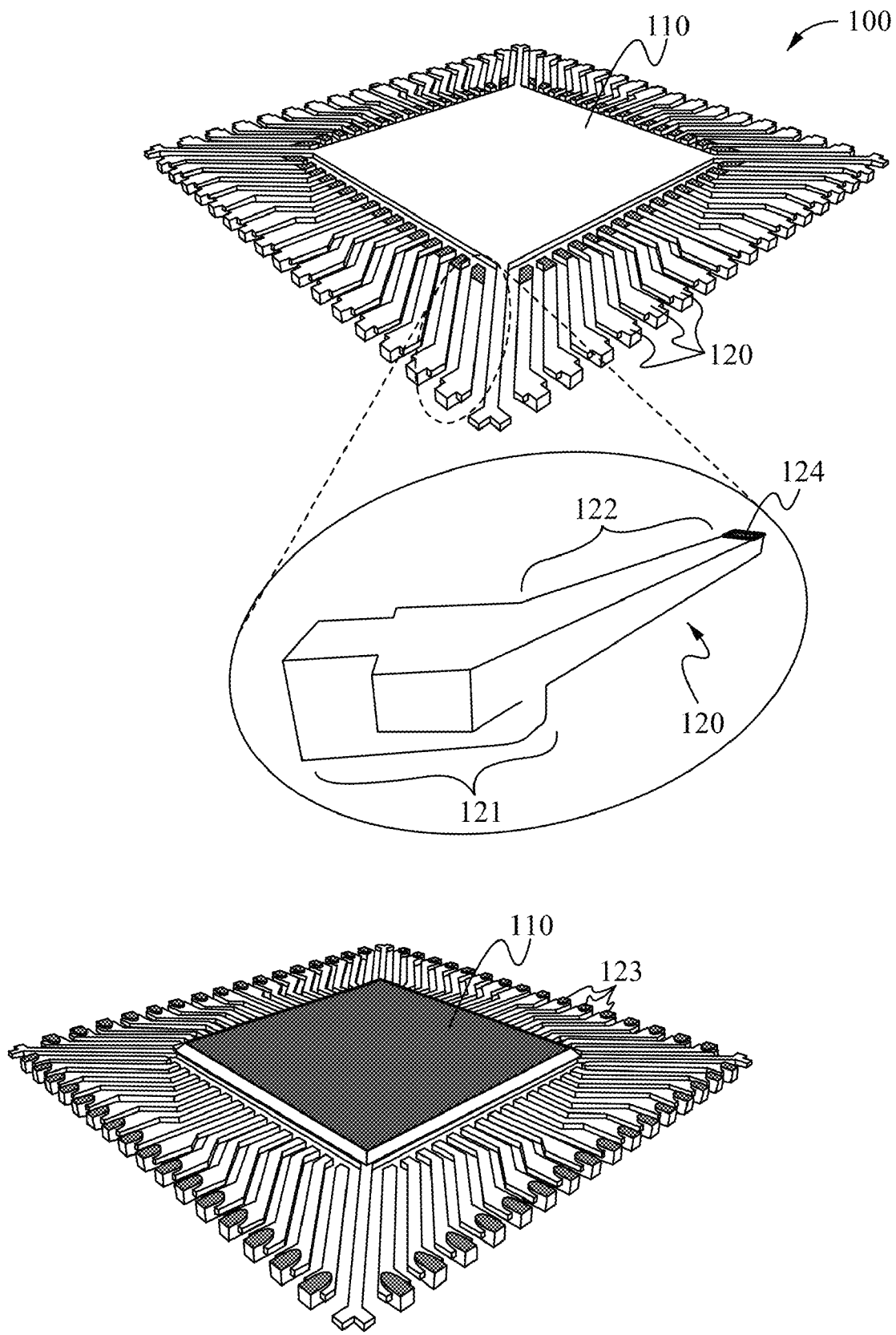
FIG. 1A shows a prior art leadframe.
Figure 1E:
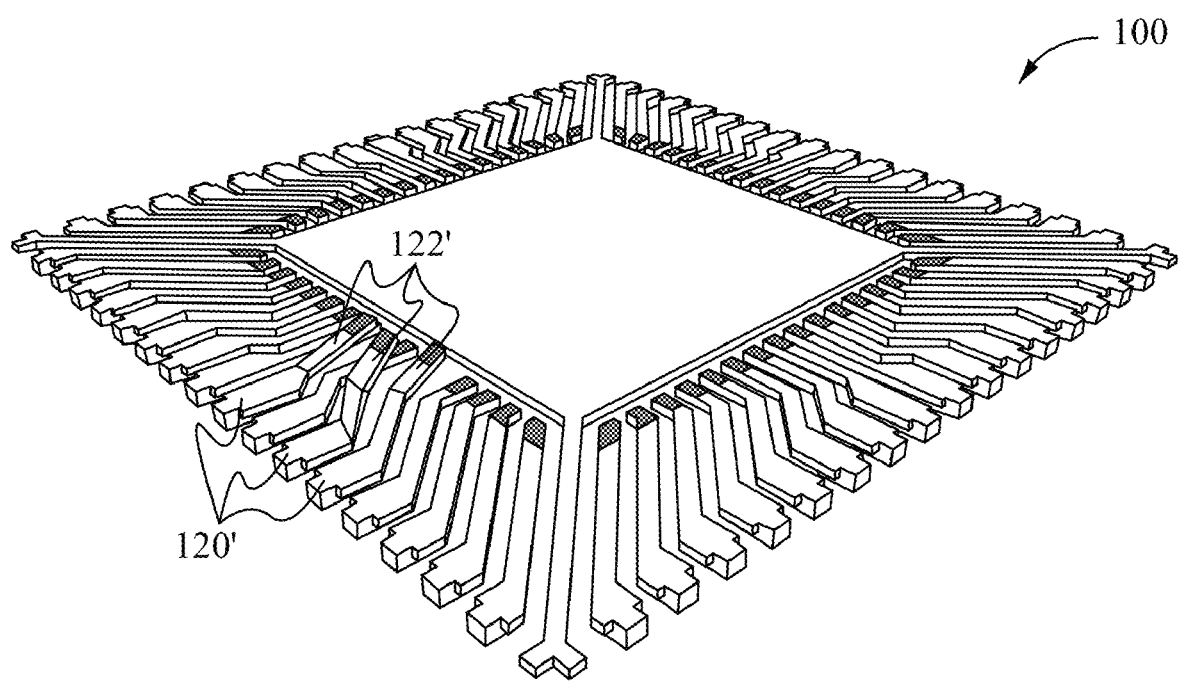
FIG. 1E shows a prior art leadframe damaged from improper handling.
Figure 2A:
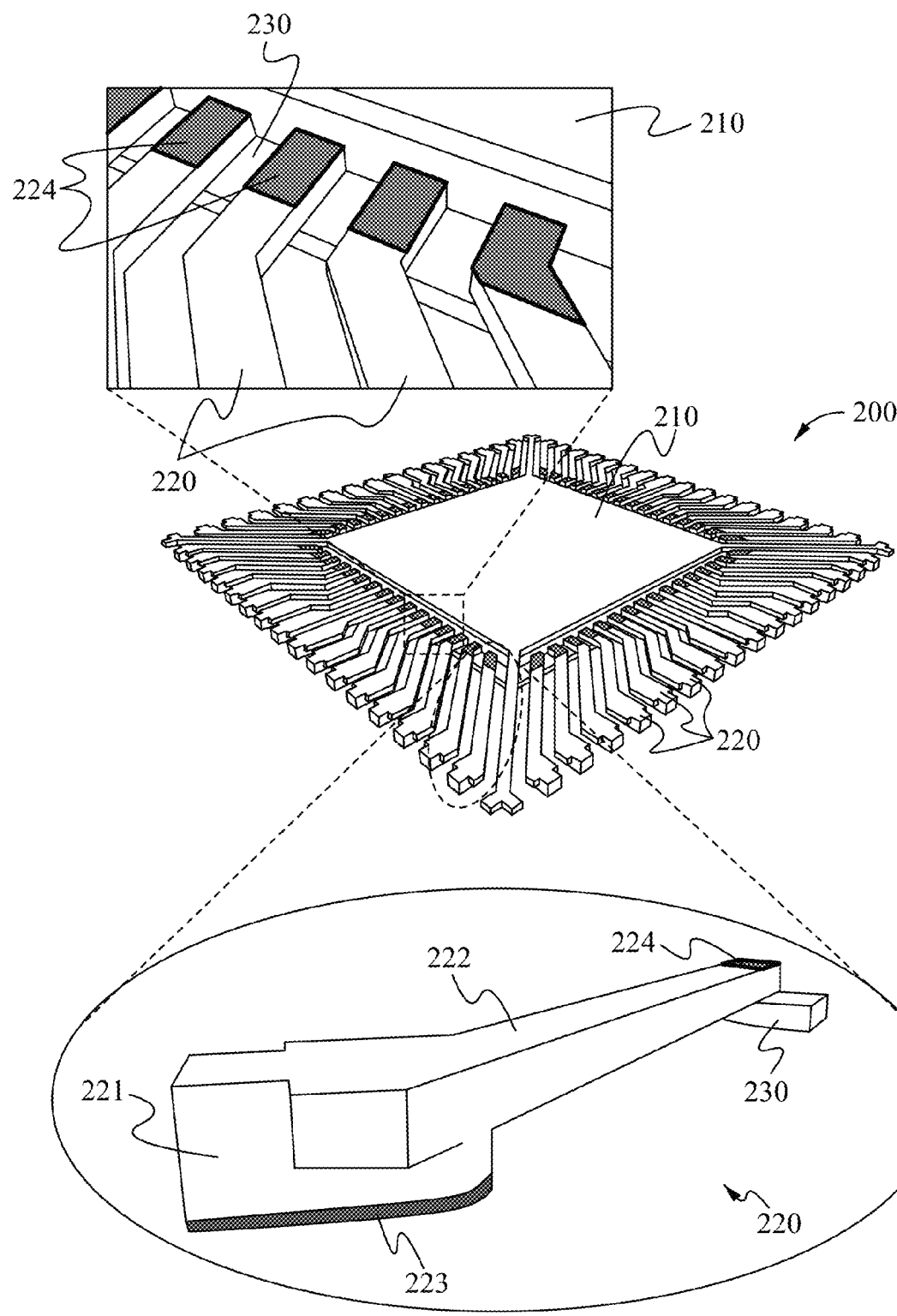
FIG. 2A shows a leadframe per an embodiment of this invention shown from a top view.

FIG. 2A shows a perspective top view leadframe 200 per an embodiment of the current invention. The leadframe 200 can be formed, for example, by an etching process from a monolithic sheet of metal, such as copper. Etching techniques for forming leadframes are well known in the prior art, and need not be described in detail in this disclosure. In general, areas in a monolithic sheet of metal that are desired to form a particular structure are coated in an etch resist material or plated in an etch resistant metal. When the monolithic sheet is submerged or otherwise affected by a material that etches metal, the undesired portions are etched away, leaving behind desired portions protected by plating or coating. Furthermore, etching can be done for prescribed periods of time so that only some of the entire thickness of a monolithic sheet of metal is etched away. The leadframe 200 as formed comprises a die attach pad 210 and a plurality of contact leads 220 that extend outward from the die attach pad 210. Each contact lead 220 has a bond pad 224 on the top surface of a proximal end with respect to the die attach pad 210. The bond pad 224 is generally a silver, gold, nickel, palladium plating, or any alloy combination thereof, or plating with any other useful material or combination of materials for effectuating the mounting of a bond wire in a later processing step. The contact lead 220 further comprises a full thickness portion 221 at a distal end with respect to the die attach pad 210. The full thickness portion 221 at the distal end and the bond pad 224 at the proximal end are joined by a partial thickness portion 222. As described above, a pattern in a monolithic sheet of metal can be partially etched to form structures of varying thicknesses. A contact pad 223 is plated onto the bottom surface of the full thickness portion 221 for contacting and being soldered to an application, such as a printed circuit board. Advantageously, the partial thickness portion 222 enables electrical connectivity between the bond pad 224 and the contact pad 223 but can be encased in a mold compound such that it is no longer exposed in a later processing step, thereby shielding the partial thickness portion 222 from potential short circuit or undesired electrical contact.

Figure 2B:
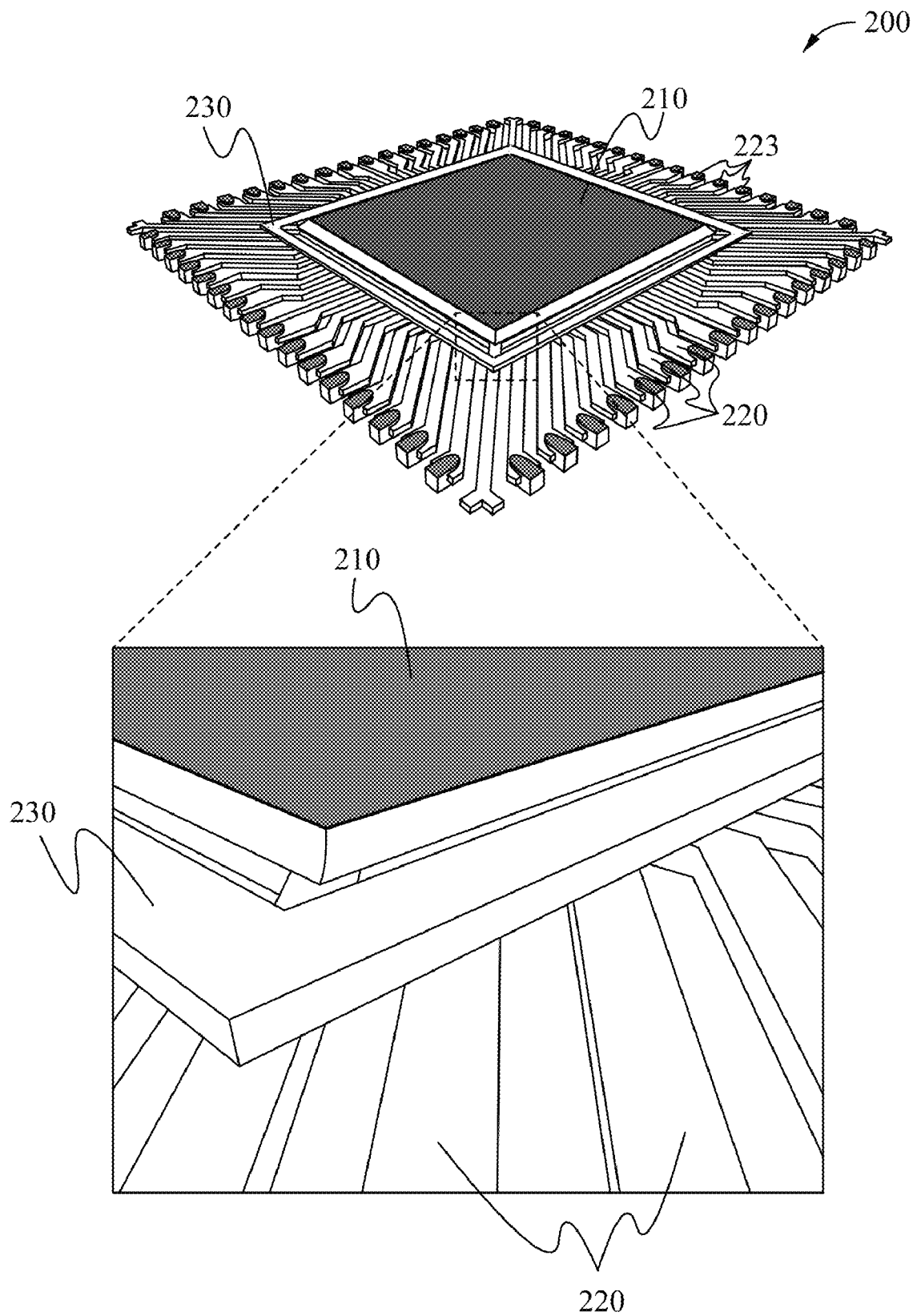
FIG. 2B shows a leadframe per an embodiment of this invention shown from a bottom view.

The leadframe 200 further comprises an auxiliary support member 230. The auxiliary support member 230 at least partially circumscribes the die attach pad 210 and can be formed in a partial etching process so that it is integrally formed with the contact leads 220. Alternatively, the auxiliary support member 230 can be mounted or soldered in place in a separate processing step. Preferably, the auxiliary support member 230 is formed as an enclosed structure that lends structural support to the partial thickness portion 222, and in particular the bond pad 224. As shown in FIG. 2B, which shows a bottom perspective view of the leadframe 200, the auxiliary support member 230 circumscribes the die attach pad 210 and supports the proximal ends of the contact leads 220. Preferably, the combined thickness of the bond pad 224, partial thickness portion 222 and the auxiliary support member 230 is approximately equal to the combined thickness of the full thickness portion 221 and the contact pad 223. Therefore, upon operation of a wire bonding machine, the leadframe 200 will be substantially planar and effectuate ease of manufacturing. Preferably, the bottom surface of the die attach pad 210 and the contact pads 223 are plated with gold, silver, palladium or nickel to effectuate a stronger weld when the device is mounted into an application, such as a printed circuit board and also as an etch resist in a later etching step for removing the auxiliary support member 230.

Figure 2C:
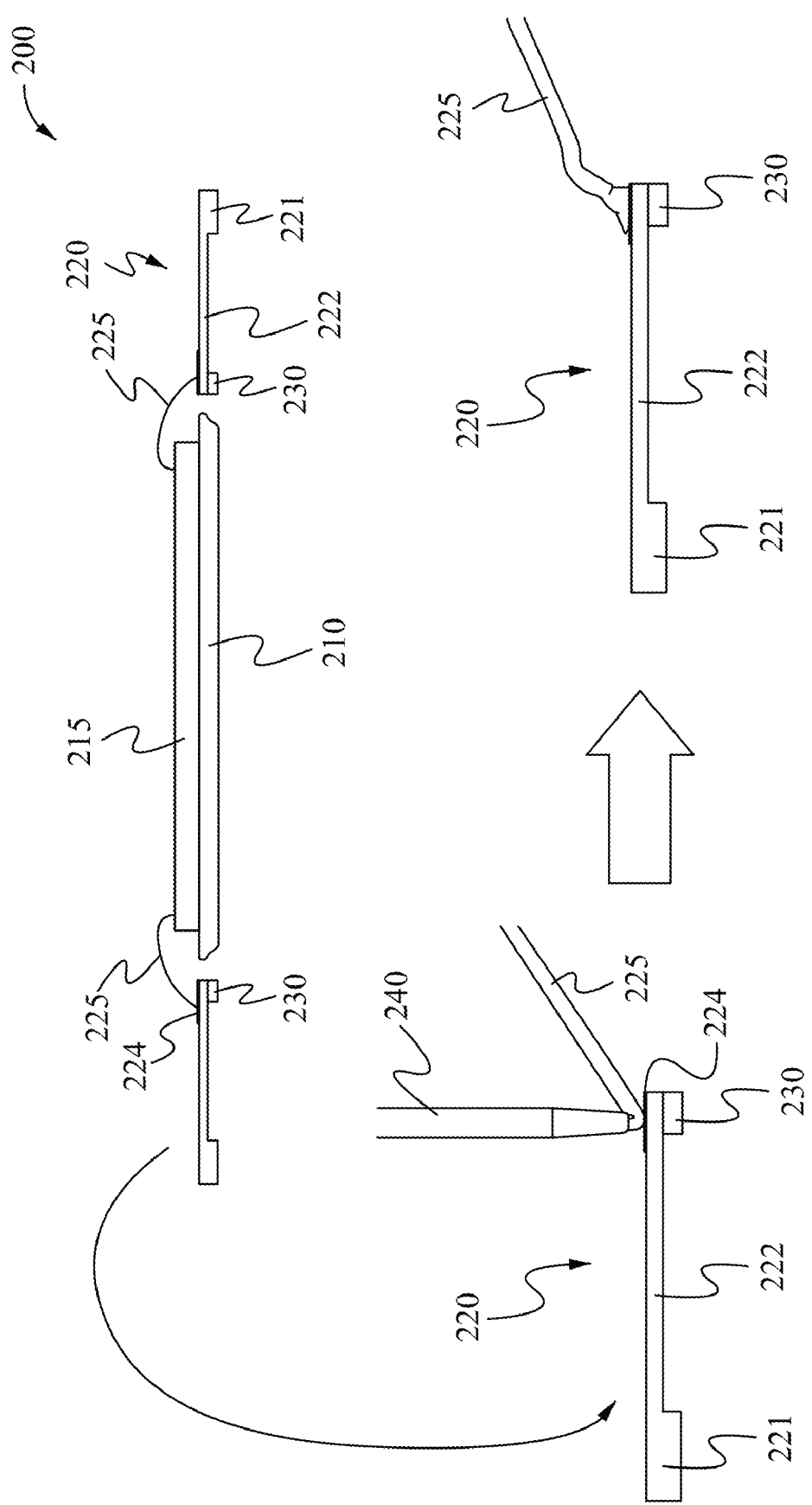
FIG. 2C shows a leadframe per an embodiment of this invention shown from in cross section.

FIG. 2C shows the leadframe 200 in cross section. A semiconductor die 215 is mounted on the die attach pad 210. A bond wire 225 is connected from the semiconductor die 215 to the bond pad 224 at the proximal end of the contact lead 220. The bond wire 225 is mounted by a capillary 240 which exerts pressure on the bond pad 224 in order to effectuate sufficient force as to permanently bond the bond wire 225 to the bond pad 224. As discussed above, the partial thickness portion in a prior art configuration bends under such pressure. Advantageously, the auxiliary support member 230 provides a normal force to the capillary 240 and prevents any bending. As a result, the contact lead 220 does not bend and the bond wire 225 does not detach from the bond pad 224 after the capillary 240 is removed.

Figure 2D:
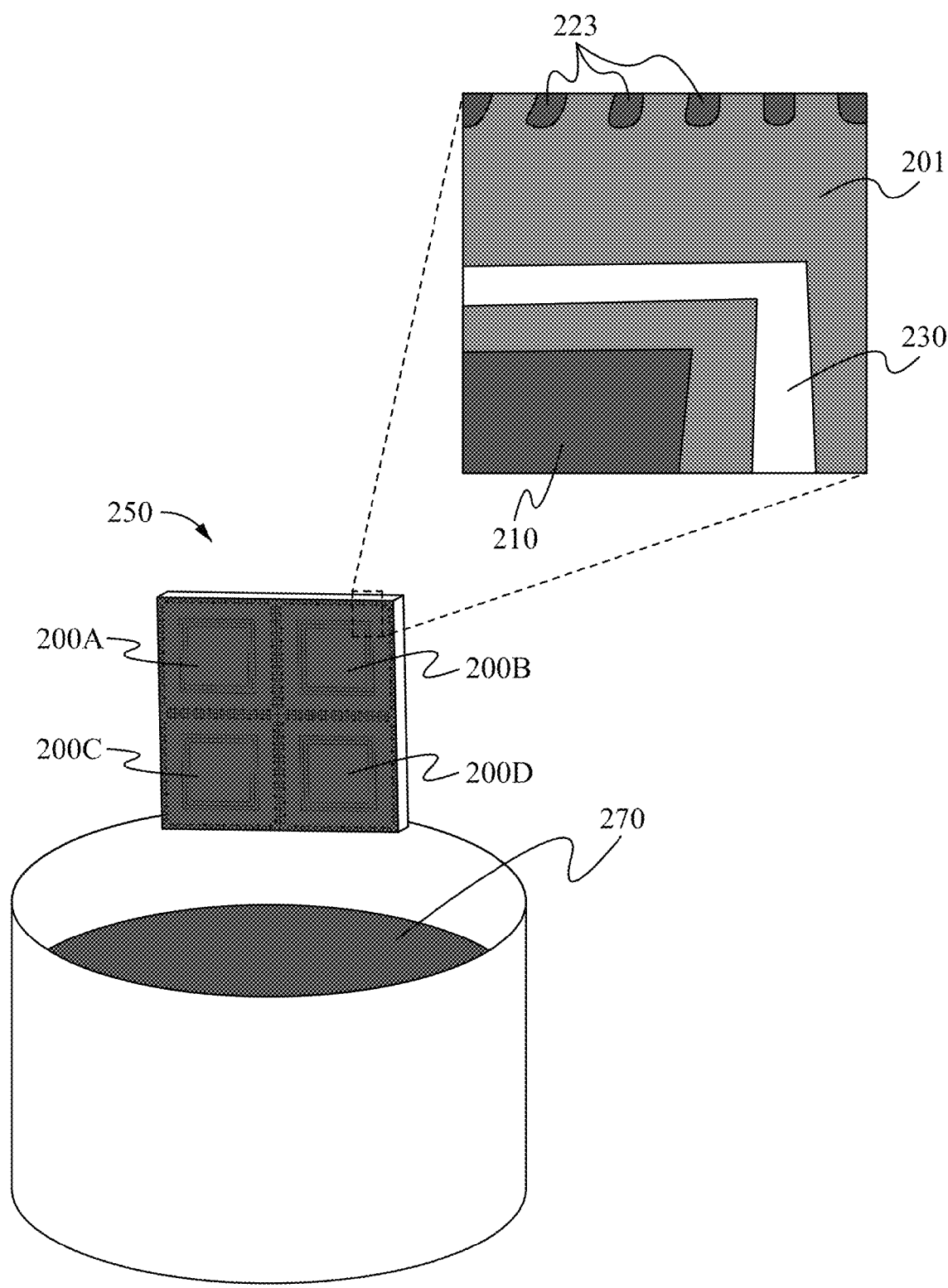
FIG. 2D shows a processing step per an embodiment of this invention.
Figure 2E:
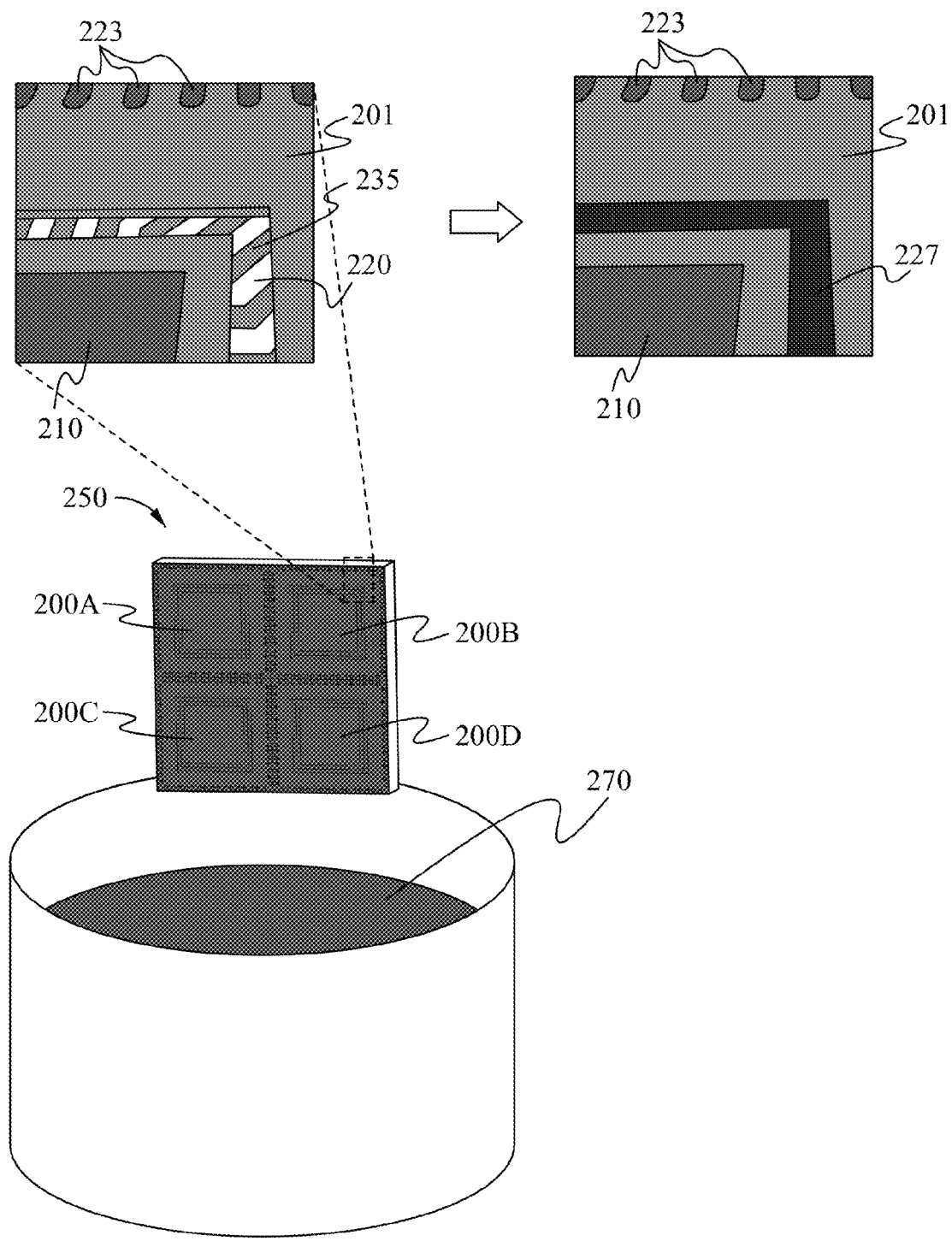
FIG. 2E shows a processing step per an embodiment of this invention.

Figure 2D shows an etching step for removal of the auxiliary support member 230 after an encasing step that is not shown for the sake of brevity and clarity. Molding steps are well known in the art of semiconductor packaging and need not be recounted in detail here. Generally, a leadframe in matrix form is encased in a suitable mold compound in a hot liquid state that dries and cools to form a plastic encapsulant, lending protection and support to all internal structures and elements. As can be appreciated, the auxiliary support member 230 electrically shorts all of the contact leads 220 together in addition to providing support. As a result, it should be removed. As discussed above, the bottom surfaces of the die attach pad 210 and the contact pads 223 are plated in an etch resistant material, whereas the bottom surface of the auxiliary support member 230 is left exposed. In general, the leadframe 210 is formed in a matrix 250 having a plurality of leadframes 200A, 200B, 200C and 200D for greater throughput during the manufacturing process. The matrix 250 is submerged in a vat having an etching solution 270 that acts on the metal from which the leadframe 200 was formed, preferably copper. FIG. 2E shows the encased leadframe 200 after an etching step. The etching step has sacrificed the auxiliary support member 230. In FIG. 2E, the bottom surface of the leadframe 200 is shown with a groove 235 in place of the support structure 230 of FIGS. 2A-2D. The support structure 230 is no longer needed as the contact leads 220, including the partial thickness portion 222 of FIG. 2A-2D, are encased in a mold compound 201 that obviates the need for any further support. In some embodiments, the groove 235 is filled in by an epoxy 227. The epoxy 227 can be filled by a dispenser or a screen print over a stencil. Both methods are well known in the prior art and need not be recounted here.

Figure 2F:
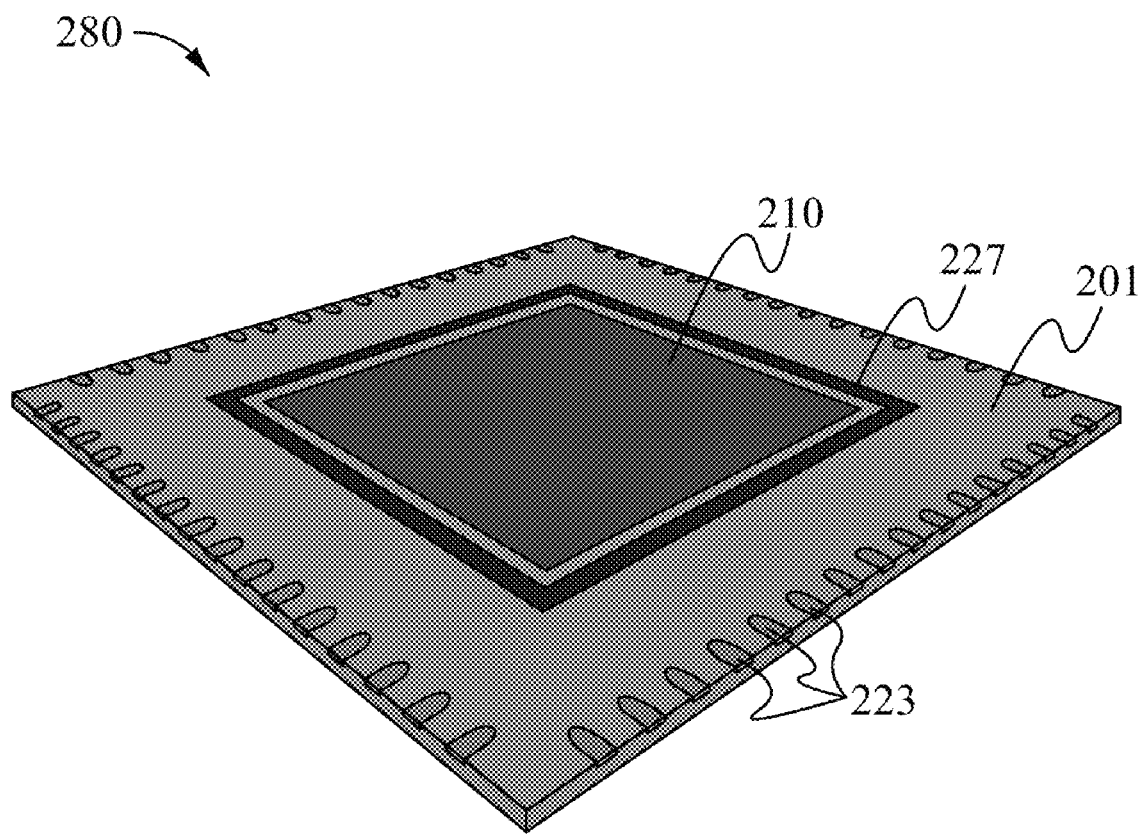
FIG. 2F shows a completed semiconductor package per an embodiment of this invention.

FIG. 2F shows an embodiment of a finished semiconductor package 280 shown from a bottom view. The contacts 223 are exposed along with the bottom surface of the die attach pad 210. In general, the bottom surface of the die attach pad 210 provides a low thermal resistance to withdraw waste heat from the semiconductor die 215 of FIG. 2D. The bottom surface of the die attach pad 210 is generally thermally coupled to a heat slug for that purpose. The contact pads 223 function as input/output for the integrated circuit. The groove, now filled with epoxy 227, circumscribes the die attach pad 210. However, the person of ordinary skill having the benefit of this disclosure will readily appreciate that the groove need not entirely encompass the die attach pad 210. Preferably, the bottom surface of the semiconductor device 280 is substantially planar for effectuating proper coupling into application, such as a printed circuit board.

Figure 3A:
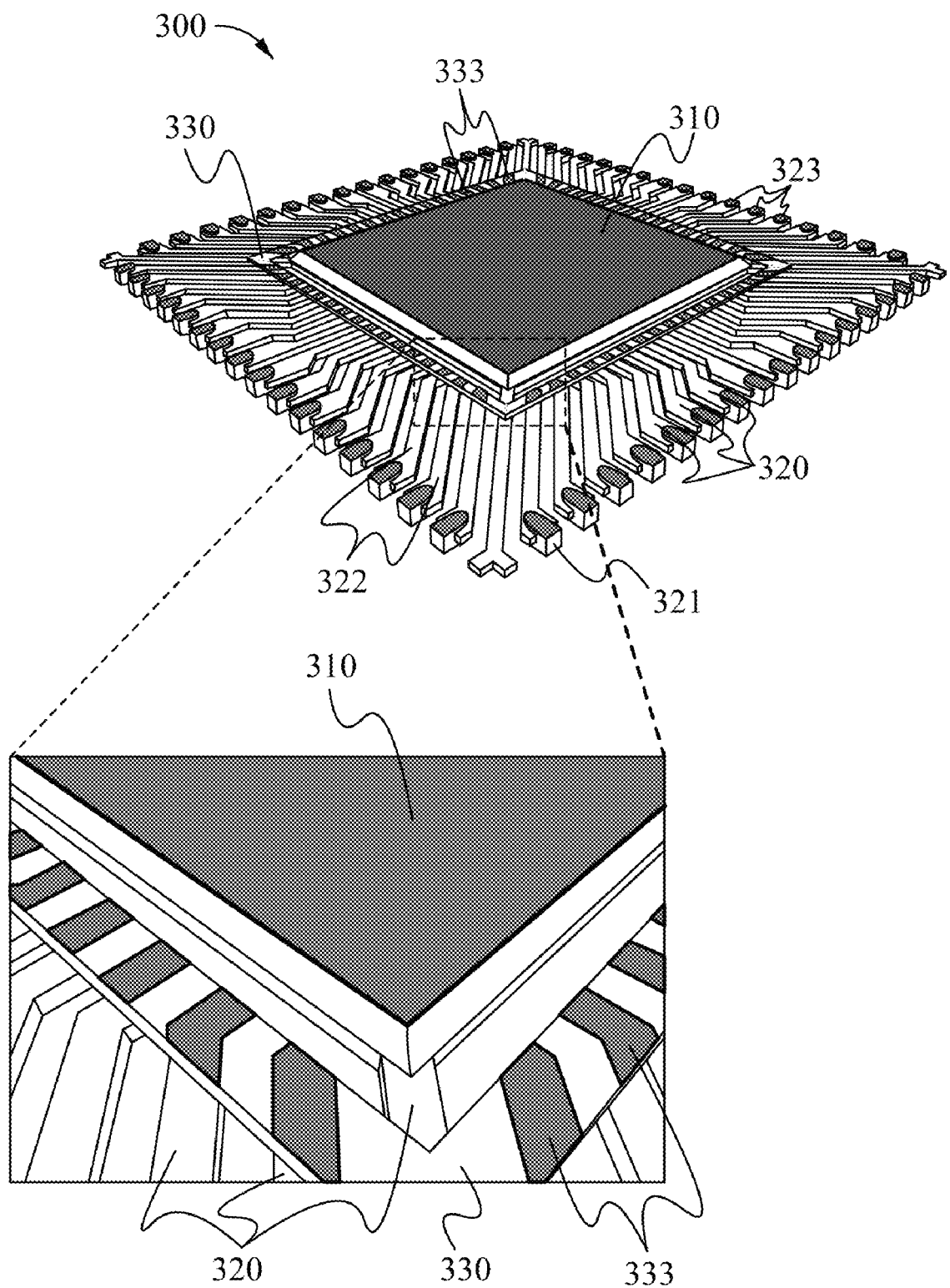
FIG. 3A shows a leadframe per an embodiment of this invention shown from a bottom view.

In some applications, more contact points are needed between a semiconductor device and an application to effectuate a more robust electrical connection between the application, such as a printed circuit board, and the semiconductor device. To that end, FIG. 3A shows an alternate embodiment of the instant invention from a bottom perspective view. A leadframe 300 is formed by an etching a pattern onto a monolithic metal substrate as described above. FIG. 3A shows the leadframe 300 from a bottom view. The leadframe 300 comprises a die attach pad 310 and a plurality of contact leads 320. Each contact lead 320 comprises a partial thickness portion 322 and a full thickness portion 321. The full thickness portion 321 is plated with a metal such as gold, silver, nickel palladium or the like forming a contact pad 323. Similarly to the embodiment described in FIGS. 2A-2F, the contact pads 323 on the bottom surface of the full thickness portion 321 are exposed when the leadframe is encased in a mold compound in a later molding process. The leadframe 300 further comprises an auxiliary support member 330. The auxiliary support member 330 circumscribes the die attach pad 310 and is formed under the contact leads 320. In the embodiment of FIG. 3A, the auxiliary support member 330 comprises plated portions 333. Preferably, the plated portions 333 are plated to correspond to particular areas of the auxiliary support member 330 that are directly below the contact leads 320 such that when the auxiliary support member 330 is sacrificed in a later etching step, the plated portions 333 remain and will be the same thickness as the full thickness portions 321. Therefore, after a later molding process, the plated portions 333 are exposed on a bottom surface of a resulting semiconductor package. As a result, the plated portions 333 are useful as a second set of contact pads for effectuating a more robust electrical connection between a semiconductor die and the application in which the semiconductor device is placed.

Figure 3B:
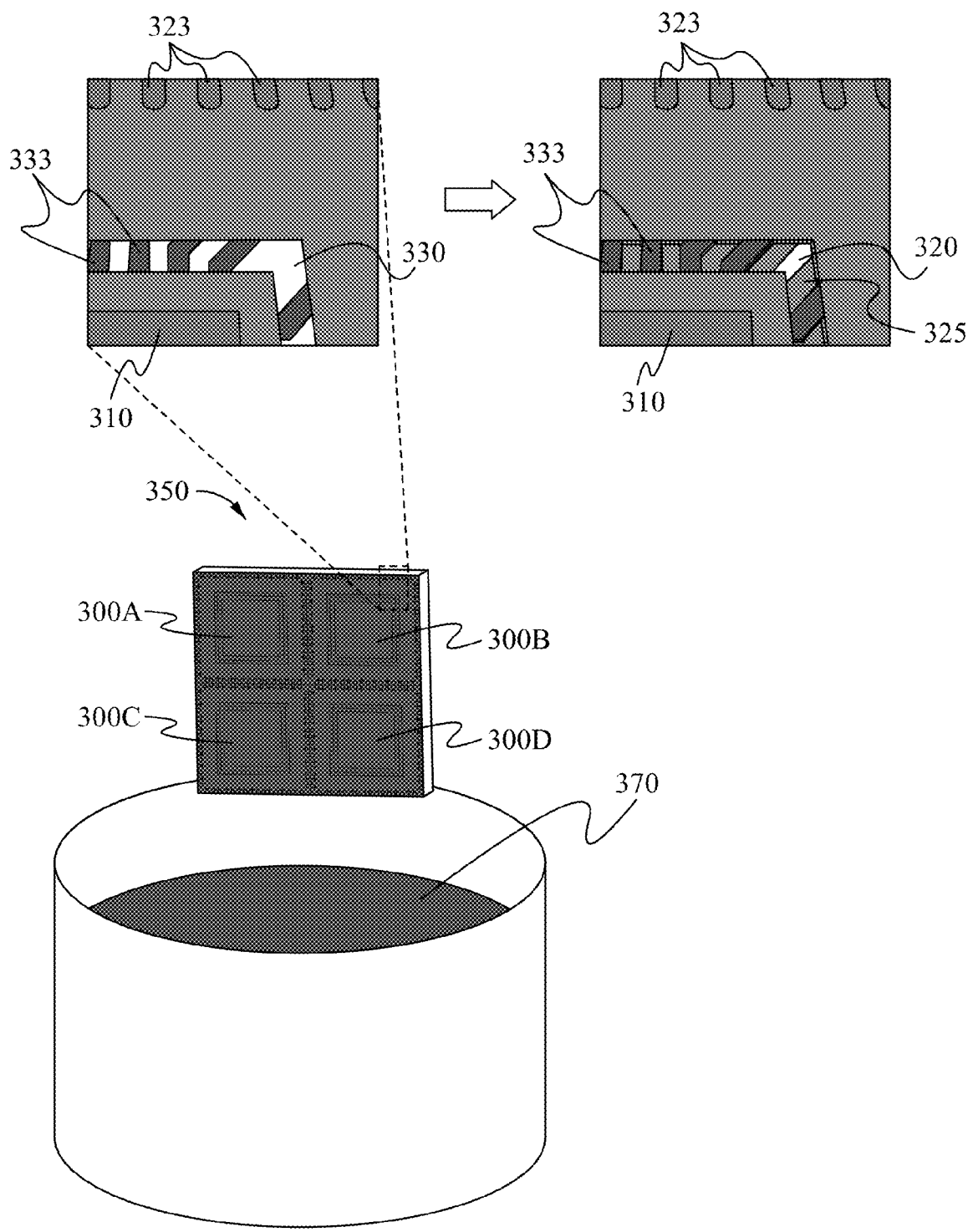
FIG. 3B shows a processing step per an embodiment of this invention.

Figure 3B shows a matrix 350 of leadframes 300A 300B 300C and 300D undergoing an etching process for sacrificing or otherwise removing the auxiliary support member 330. The plated portions 333, the contact pads 323 and the bottom surface of the die attach pad 310 are resistant to etching solutions. As a result, the exposed portions of the auxiliary support member 330 will dissolve when the matrix 350 is submerged in a vat having an etching solution 370. What is left behind is a groove 325 intermittently filled by the plated portions 333. Optionally, the groove 325 is filled with an epoxy by an injection or a screen and stencil step.

Figure 3C:
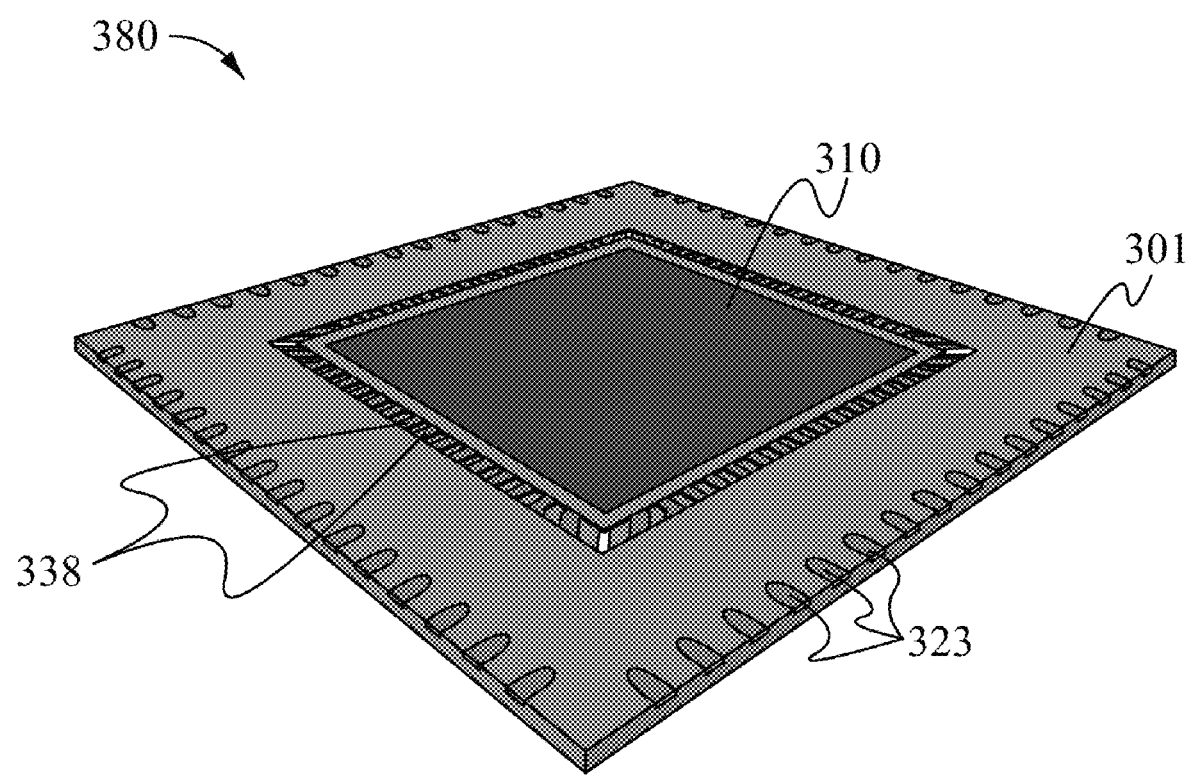
FIG. 3C shows a processing step per an embodiment of this invention.

FIG. 3C shows an embodiment of a finished semiconductor package 380 shown from a bottom view. The contact pads 323 are exposed along with the bottom surface of the die attach pad 310. In general, the bottom surface of the die attach pad 310 provides a low thermal resistance to withdraw waste heat from a semiconductor die, such as 215 FIG. 2D. The bottom surface of the die attach pad 310 is generally thermally coupled to a heat slug for that purpose. The contact pads 323 function as input/output for the integrated circuit. The groove 325 comprises another set of contact pads 333 and circumscribes the die attach pad 310. However, the person of ordinary skill having the benefit of this disclosure will readily appreciate that the groove need not entirely encompass the die attach pad 310. Preferably, the bottom surface of the semiconductor device 380 is substantially planar for effectuating proper coupling into application, such as a printed circuit board.

Figure 4:
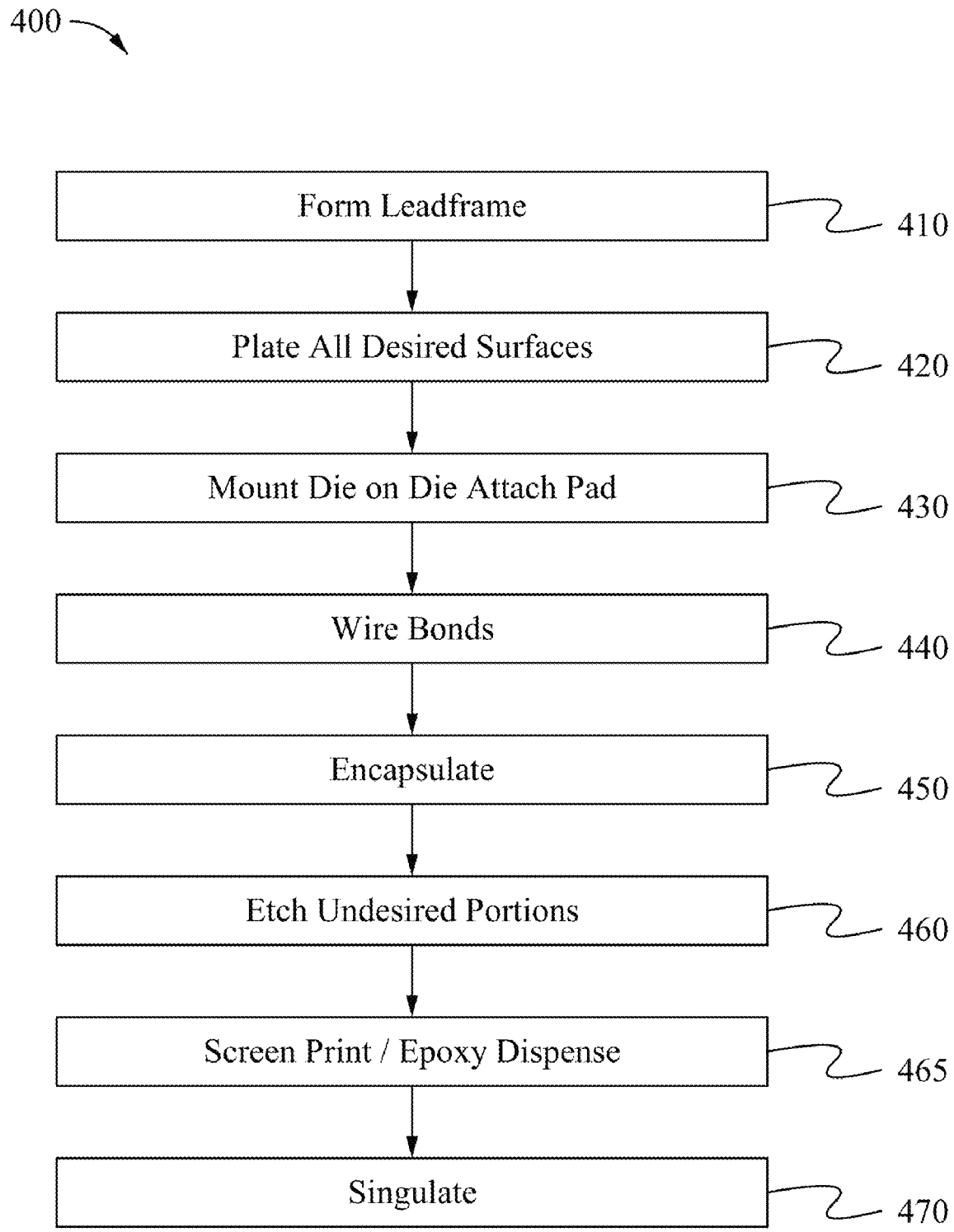
FIG. 4 shows a process flowchart per an embodiment of this invention.

FIG. 4 is a flowchart diagram of a method 400 for manufacturing a semiconductor package as described in the preceding Figures. In a step 410, a leadframe is formed by etching a desired pattern from a monolithic metal substrate by plating or coating desired portions of the substrate and allowing the remaining portions to be sacrificed by an etching solution. Preferably, forming a leadframe comprises forming a die attach pad, a plurality of contact leads each having a full thickness portion and a partial thickness portion, and an auxiliary support member for providing support to the partial thickness portion during a later wire bonding step. In a step 420, portions defining contact pads and the die attach pad are plated in an etch resist material for a later etching step. As described above, in some embodiments, the entirety of the auxiliary support member is left unplated such that the whole auxiliary support member is sacrificed in a later etching step. Alternatively, a pattern is etched onto the auxiliary support member such that a second set of contact pads is formed when the auxiliary support member is partially sacrificed in a later processing step. In a step 430, a die is mounted on the die attach pad. In a step 440, wire bonds are placed between contact pads on a proximal end of each of the contact leads and the die, thereby effectuating electrical contact therebetween. In a step 450, the leadframe, die, and wire bonds are at least partially encapsulated in a mold compound. Preferably, the bottom surfaces of the contact pads, the die attach pad and the auxiliary support member are exposed as described above. In a step 460, the now encapsulated device is submerged or otherwise affected by an etching solution that etches unplated exposed areas. In some embodiments, the entirety of the auxiliary support member is sacrificed. Alternatively, portions of the auxiliary support member are sacrificed leaving behind a second set of contact pads. Advantageously, the contact pads are electrically isolated with respect to each other upon etching the auxiliary support member. Optionally, in a step 465, the groove can be filled with an epoxy or other suitable material through a screen printing process using a screen stencil or epoxy dispense using a dispenser. Although the foregoing process has been described in the singular, it is well known in the art of semiconductor manufacturing that leadframes are processed in matrix form with each matrix having a plurality of leadframes. To that end, in a step 470, the matrix is singulated to form individual packaged units such as the ones shown in FIGS. 2F and 3C.

The present invention has been described in terms of specific embodiments incorporating details to facilitate the understanding of the principles of construction and operation of the invention. The specific configurations shown and the methodologies described in relation to the various modules and the interconnections therebetween are for exemplary purposes only. By way of example, partial thickness portions are referenced herein. However, the person of ordinary skill having the benefit of this disclosure will readily appreciate that the thickness of any structure or member discussed herein need not be precisely partial the thickness of an original monolithic metal substrate from which the leadframe has been etched. Rather, the partial etched portions can be generalized as partially etched portions. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:
1. A semiconductor package comprising:
 a. a die attach pad;
 b. at least one semiconductor die coupled with the die attach pad;
 c. a groove grooved ring at least partially circumscribing the die attach pad and an encapsulant;
 d. a set of contact leads extending outwards from the die attach pad, each contact lead having a proximal end to the die attach pad and a distal end, wherein the proximal end is positioned over and exposed by the groove; and
 e. a plurality of bond wires for electrically coupling the die to at least one contact pad.

2. The semiconductor package of claim 1 wherein each contact lead comprises a full thickness portion at the distal end.

3. The semiconductor package of claim 1 wherein each contact lead comprises a partial thickness portion at the proximal end.

4. The semiconductor package of claim 1 wherein each contact lead comprises a contact pad on a bottom surface of the distal end.

5. The semiconductor package of claim 4 wherein each contact lead comprises a contact pad on a bottom surface of the proximal end.

6. The semiconductor package of claim 1 wherein a bottom surface of the semiconductor package is substantially planar.

7. The semiconductor package of claim 6 wherein a bottom surface of the die attach pad and bottom surfaces of the contact leads define the substantially planar bottom surface of the package.

8. The semiconductor package of claim 1 wherein the grooved ring is filled by a discrete epoxy filler.

9. The semiconductor package of claim 1 further comprising a mold compound at least partially encasing the at least one semiconductor die, the set of contact leads and the plurality of bond wires, wherein the groove is formed in the mold compound and is positioned outside a perimeter of the die attach pad.

10. A method of making a semiconductor package comprising:
 a. etching a through pattern in a metal substrate, thereby forming a die attach pad, a set of contact leads having a first set of contact pads surrounding the die attach pad and an auxiliary support member at least partially circumscribing the die attach pad, wherein each contact lead has a protruding portion at a proximal end to the die attach pad, the protruding portion having a first contact pad, and a distal end of the contact lead having a second contact pad, further wherein the protruding portion of each contact lead is positioned over and supported by the auxiliary support member;
 b. mounting at least one semiconductor die on the die attach pad;
 c. mounting bond wires for electrically coupling the at least one semiconductor die to at least one first contact pad;
 d. at least partially encasing the semiconductor die, bond wires, auxiliary support member and contact leads in a mold compound while leaving one surface of the metal substrate exposed;
 e. etching away at least a portion of the auxiliary support member thereby electrically isolating the contact leads from each other.

11. The method of claim 10 wherein forming the set of contact leads comprises forming a full thickness portion at the distal end such that the distal end is self-supporting.

12. The method of claim 10 wherein etching away at least the portion of the auxiliary support member comprises removing a portion of the auxiliary support member positioned between adjacent contact leads while leaving intact a portion of the auxiliary support member positioned underneath the proximal end of each contact lead.

13. The method of claim 12 wherein etching away at least the portion of the auxiliary support member forms a second set of contact pads such that the portion of the auxiliary support member positioned underneath the proximal end of each contact lead has a third contact pad.

14. The method of claim 10 further comprising filling the etched portion of the auxiliary support member with an epoxy.

15. The method of claim 14 wherein filling the etched portion of the auxiliary support member with epoxy comprises a stencil step.

16. The method of claim 14 wherein filling the etched portion of the auxiliary support member with epoxy comprises a nozzle filling step.

17. The method of claim 10 wherein etching away at least the portion of the auxiliary support member forms a groove at least partially circumscribing the die attach pad.

* * * * *